(12) United States Patent
Dokan

(10) Patent No.: US 9,870,901 B2
(45) Date of Patent: Jan. 16, 2018

(54) METHOD OF PRODUCING PROCESSING CONDITION OF PLASMA PROCESSING APPARATUS, AND PLASMA PROCESSING APPARATUS

(71) Applicant: TOKYO ELECTRON LIMITED, Tokyo (JP)

(72) Inventor: Takashi Dokan, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 145 days.

(21) Appl. No.: 15/146,018

(22) Filed: May 4, 2016

(65) Prior Publication Data
US 2016/0329194 A1 Nov. 10, 2016

(30) Foreign Application Priority Data
May 7, 2015 (JP) .................................. 2015-095091

(51) Int. Cl.
*H01J 37/32* (2006.01)
*H01L 21/3065* (2006.01)

(52) U.S. Cl.
CPC .. *H01J 37/32917* (2013.01); *H01J 37/32192* (2013.01); *H01J 37/32311* (2013.01); *H01J 37/32926* (2013.01); *H01L 21/3065* (2013.01)

(58) Field of Classification Search
CPC .......... H01J 37/32917; H01J 37/32926; H01J 37/32311; H01J 37/32192; H01L 21/3065
See application file for complete search history.

(56) References Cited

U.S. PATENT DOCUMENTS

| | | | | |
|---|---|---|---|---|
| 6,774,570 | B2 * | 8/2004 | Tsuchiya | C23C 16/505 315/111.21 |
| 7,404,991 | B2 * | 7/2008 | Ohmi | H01J 37/32192 118/723 AN |
| 2005/0098116 | A1 * | 5/2005 | Yamagishi | H01J 37/32183 118/722 |
| 2009/0255800 | A1 * | 10/2009 | Koshimizu | H01J 37/32165 204/164 |

(Continued)

FOREIGN PATENT DOCUMENTS

JP 2008-10598 A 1/2008

*Primary Examiner* — Anita Alanko
(74) *Attorney, Agent, or Firm* — Rothwell, Figg, Ernst & Manbeck, P.C.

(57) ABSTRACT

Disclosed is a method of producing a processing condition of a plasma processing apparatus. The method includes producing a plurality of processing conditions having different processing parameters, which are applied to an intermediate process performed between an ignition process that ignites plasma of a processing gas using a high frequency wave and a processing process that processes a workpiece by the plasma; sequentially performing the ignition process, the intermediate process applied with each of the processing conditions, and the processing process; measuring, when the intermediated process is changed to the processing process, a power of a reflected wave of the high frequency wave during the processing process in association with each of the processing conditions; and selecting, among the plurality of processing conditions, a processing condition in which the power of the reflected wave of the high frequency wave is minimized.

5 Claims, 11 Drawing Sheets

(56) References Cited

U.S. PATENT DOCUMENTS

| | | | | |
|---|---|---|---|---|
| 2010/0300620 | A1* | 12/2010 | Kanda | H01J 37/321 |
| | | | | 156/345.28 |
| 2013/0062341 | A1* | 3/2013 | Ashida | H01J 37/32192 |
| | | | | 219/715 |
| 2014/0203821 | A1* | 7/2014 | Yamamoto | H01J 37/32917 |
| | | | | 324/654 |
| 2014/0231389 | A1* | 8/2014 | Nagami | H01J 37/32091 |
| | | | | 216/67 |
| 2015/0212127 | A1* | 7/2015 | Ikeda | H05H 1/46 |
| | | | | 324/638 |
| 2015/0371832 | A1* | 12/2015 | Yanai | H01L 21/67028 |
| | | | | 438/714 |

* cited by examiner

FIG.3

|  | Gas supply Process | Ignition Process | Processing Process | ... |
|---|---|---|---|---|
| Process Content | Gas Supply | Ignition | Plasma Processing | ... |
| Time [sec] | 60 | 2 | 60 | ... |
| Pressure [mTorr] | 100 | 100 | 20 | ... |
| MW [W] | 0 | 2000 | 3000 | ... |
| RF [W] | 0 | 0 | 0 | ... |
| Gas O2 [Sccm] | 50 | 50 | 200 | ... |
| Gas Ar [Sccm] | 500 | 500 | 0 | ... |

FIG.4

Input pressure (1) Intermediate pressure: 60 mTorr
(2) Pressure every 10 mTorr
(3) Pressure every 5 mTorr
(4) Arbitrarily input

FIG.5

```
Input kind and flow rate of processing gas (1) O2=200, Ar=0
(2) O2=100, Ar=200
(3) O2=50 , Ar=200
(4) Arbitrarily input
```

FIG.6

```
Input power of microwave (1) MW=2000W
(2) MW=2500W
(3) MW=3000W
(4) Arbitrarily input
```

FIG.7

Input processing time (1) 2sec
(2) 2.5sec
(3) 3sec
(4) Arbitrarily input

FIG.8

| Processing Condition | #1 | #2 | #3 | #4 |
|---|---|---|---|---|
| Time [sec] | 2 | 2 | 2 | 2 |
| Pressure [mTorr] | 40 | 40 | 40 | 40 |
| MW [W] | 3000 | 3000 | 3000 | 3000 |
| RF [W] | 0 | 0 | 0 | 0 |
| Gas O2 [Sccm] | 200 | 200 | 100 | 50 |
| Gas Ar [Sccm] | 0 | 100 | 200 | 200 |

METHOD OF PRODUCING PROCESSING CONDITION OF PLASMA PROCESSING APPARATUS, AND PLASMA PROCESSING APPARATUS

CROSS-REFERENCE TO RELATED APPLICATIONS

This application is based on and claims priority from Japanese Patent Application No. 2015-095091 filed on May 7, 2015 with the Japan Patent Office, the disclosure of which is incorporated herein in its entirety by reference.

TECHNICAL FIELD

Various aspects and exemplary embodiments of the present disclosure relate to a method of producing a processing condition of a plasma processing apparatus, and a plasma processing apparatus.

BACKGROUND

There is a plasma processing apparatus using excitation of a processing gas by a high frequency wave. Such a plasma processing apparatus includes, for example, an antenna that radiates a microwave, which is an example of the high frequency wave. And, in the plasma processing apparatus, the microwave is radiated from the antenna into the processing container, and the processing gas in the processing container is ionized to ignite plasma, so that a workpiece such as, for example, a substrate is subjected to a plasma processing by the plasma.

In the plasma processing apparatus, however, when changing processes, the reflection of a high frequency wave (e.g., a microwave) may occur depending on employed processing conditions. For example, when an ignition process of igniting the plasma of the processing gas is changed to a processing process of performing a plasma processing on a workpiece, the reflection of the high frequency wave occurs. The reflection of the high frequency wave becomes a factor that damages components disposed on the upstream side of the components that supplies a high frequency wave (e.g., an antenna), and thus, is not desirable.

For such a problem, various studies have been made on a technique for suppressing the reflection of the high frequency wave by performing, between the ignition process and the processing process, an intermediate process under a different processing condition from those of the ignition process and the processing process. For example, there is a technique of performing an intermediate process using, as a processing condition, a pressure between a pressure applied to the intermediate process and a pressure applied to the processing process. See, for example, Japanese Patent Laid-Open Publication No. 2008-010598.

SUMMARY

According to an aspect, the present disclosure provides a method of producing a processing condition of a plasma processing apparatus. The method includes: producing a plurality of processing conditions having different processing parameters, which are applied to an intermediate process performed between an ignition process that ignites plasma of a processing gas using a high frequency wave and a processing process that processes a workpiece by the plasma; sequentially performing the ignition process, the intermediate process applied with each of the processing conditions, and the processing process; measuring, when the intermediated process is changed to the processing process, a power of a reflected wave of the high frequency wave during the processing process in association with each of the processing conditions; and selecting, among the plurality of processing conditions, a processing condition in which the power of the reflected wave of the high frequency wave is minimized.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIG. 3 is a view illustrating an exemplary recipe.

FIG. 4 is a view illustrating an exemplary input screen for inputting a pressure inside a processing container in an intermediate process.

FIG. 5 is a view illustrating an exemplary input screen for inputting a kind and a flow rate of a processing gas in the intermediate process.

FIG. 6 is a view illustrating an exemplary input screen for inputting a power of a microwave in the intermediate process.

FIG. 7 is a view illustrating an exemplary input screen for inputting a processing time in the intermediate process.

FIG. 8 is a view illustrating exemplary processing conditions produced by the processing condition producing processing.

DETAILED DESCRIPTION

Figure 1:
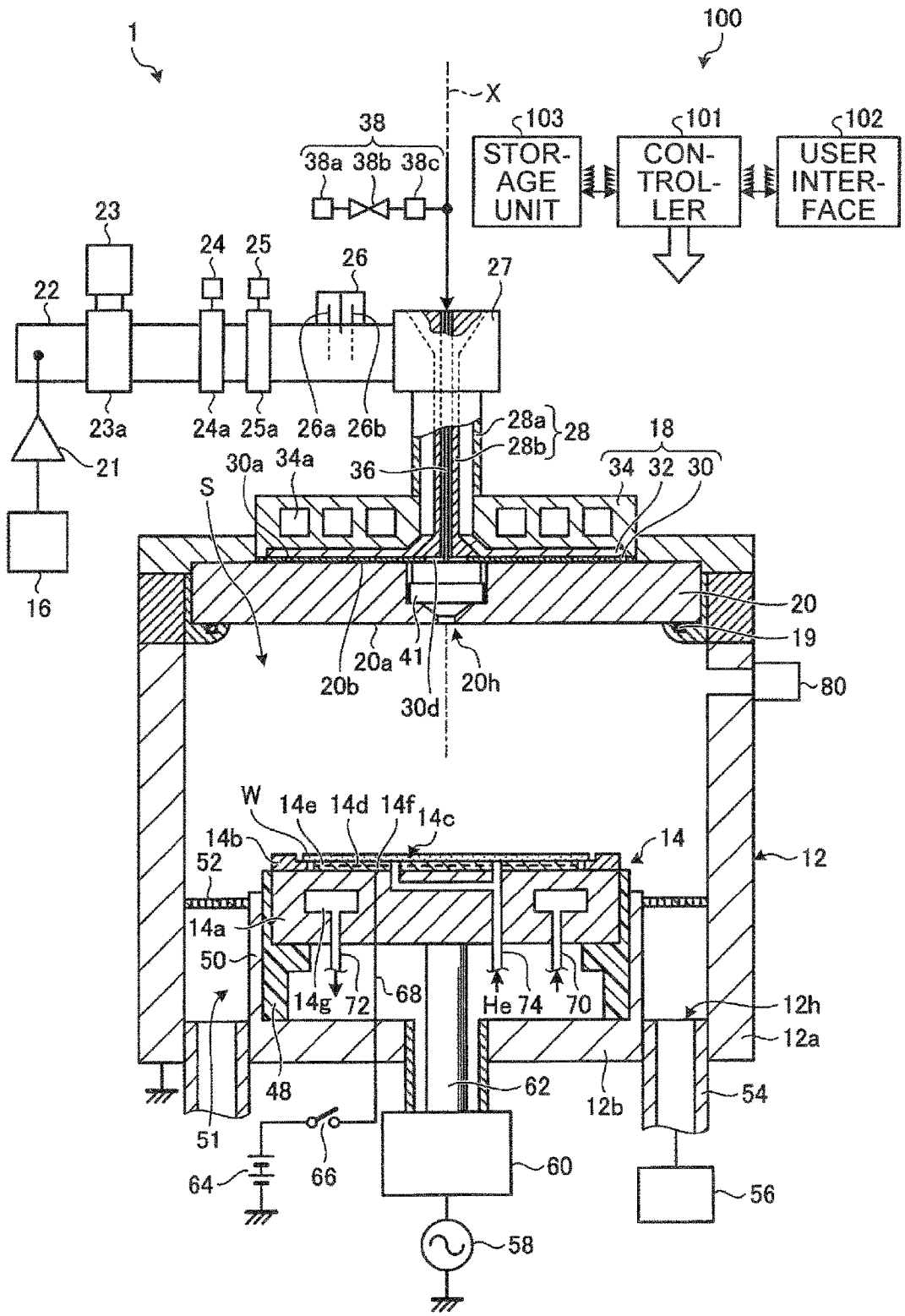
FIG. 1 is a schematic view illustrating a plasma processing apparatus according to a first exemplary embodiment.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional technique, it was not considered to automatically produce an appropriate processing condition that suppresses the reflection of a high frequency wave.

That is, in the conventional technique, a user of the plasma processing apparatus prepares a processing condition including processing parameters such as, for example, a pressure, which is applied in the intermediate process. Thus, in the conventional technique, since the values of the processing parameters included in the processing condition vary depending on the skill of the user of the plasma processing apparatus, an appropriate processing condition that suppresses the reflection of the high frequency wave may not be generated. Further, in the conventional technique, in a case where the reflection of the high frequency wave is not suppressed with respect to one processing condition, tasks to prepare a plurality of processing conditions and to perform an evaluation by applying each of the processing conditions to the intermediate process are generated, which may increase burden on the user of the plasma processing apparatus.

According to an aspect, the present disclosure provides a method of producing a processing condition of a plasma processing apparatus. The method includes: producing a plurality of processing conditions having different processing parameters, which are applied to an intermediate process performed between an ignition process that ignites plasma of a processing gas using a high frequency wave and a processing process that processes a workpiece by the plasma; sequentially performing the ignition process, the intermediate process applied with each of the processing conditions, and the processing process; measuring, when the intermediated process is changed to the processing process, a power of a reflected wave of the high frequency wave during the processing process in association with each of the processing conditions; and selecting, among the plurality of processing conditions, a processing condition in which the power of the reflected wave of the high frequency wave is minimized.

In the above-described method, the plasma processing apparatus further includes a high frequency wave power source configured to supply a second high frequency wave that is different from the high frequency wave, to a placing table on which the workpiece is placed. The measuring measures, when the intermediated process is changed to the processing process, the power of the reflected wave of the high frequency wave during the processing process and a power of a reflected wave of the second high frequency wave during the processing process in association with each of the processing conditions. The selecting selects, among the plurality of processing conditions, a processing condition in which the power of the reflected wave of the high frequency wave is minimized and the power of the reflected wave of the second high frequency wave is minimized.

In the above-described method, the measuring measures, when the intermediated process is changed to the processing process, the power of the reflected wave of the high frequency wave during the processing process and a luminous intensity of the plasma during the processing process in association with each of the processing conditions. The selecting selects, among the plurality of processing conditions, a processing condition in which the power of the reflected wave of the high frequency wave is minimized, and when the luminous intensity of the plasma in association with the selected processing condition is less than a predetermined value, cancel the processing condition.

In the above-described method, the processing parameter is at least one selected from a pressure inside a processing container to which the high frequency wave is radiated, a kind of the processing gas, a flow rate of the processing gas, a power of the high frequency wave, a frequency of the high frequency wave, a power of the second high frequency wave supplied to the placing table on which the workpiece is placed, a frequency of the second high frequency wave, and a processing time.

In the above-described method, the plasma processing apparatus includes a storage unit configured to store a recipe used when the ignition process, the intermediate process, and the processing process are performed. The selecting rewrites the recipe such that the selected processing condition is applied to the intermediate process.

According to an aspect, the present disclosure provides a plasma processing apparatus including: a high frequency wave supply unit configured to supply a high frequency wave; and a control unit configured to: produce a plurality of processing conditions having different processing parameters, which are applied to an intermediate process performed between an ignition process that ignites plasma of a processing gas using a high frequency wave and a processing process that processes a workpiece by the plasma; sequentially perform the ignition process, the intermediate process applied with each of the processing conditions, and the processing process; measure, when the intermediated process is changed to the processing process, a power of a reflected wave of the high frequency wave during the processing process in association with each of the processing conditions; and selects, among the plurality of processing conditions, a processing condition in which the power of the reflected wave of the high frequency wave is minimized.

According to various aspects and exemplary embodiments of the present disclosure, a method of producing a processing condition of a plasma processing apparatus, which is capable of automatically producing an appropriate processing condition with a suppressed reflection of a high frequency wave, and a plasma processing apparatus, are realized.

Hereinafter, various exemplary embodiments of the present disclosure will be described in detail with reference to the drawings. Meanwhile, in the respective drawings, the same or corresponding parts will be denoted by the same symbols.

First Exemplary Embodiment

FIG. 1 is a schematic view illustrating a plasma processing apparatus according to a first exemplary embodiment. The plasma processing apparatus 1 illustrated in FIG. 1 includes a processing container 12, a stage 14, a phase locked loop (PLL) oscillator 16, an antenna 18, a dielectric window 20, and a control unit 100.

The processing container 12 defines a processing space S for performing a plasma processing. The processing container 12 includes a sidewall 12a and a bottom portion 12b. The sidewall 12a is formed in a substantially cylindrical shape. Hereinafter, an axis X that extends in the center of the cylindrical shape of the sidewall 12a is virtually set, and the extension direction of the axis X will be referred to as an axis X direction. The bottom portion 12b is formed at the lower end side of the sidewall 12a, and covers the bottom side opening of the sidewall 12a. An exhaust hole 12 for exhaust is formed in the bottom portion 12b. The upper end portion of the sidewall 12a is opened.

The upper end opening of the sidewall 12a is closed by the dielectric window 20. An O-ring 19 is interposed between the dielectric window 20 and the upper end portion of the sidewall 12a. The dielectric window 20 is provided in the upper end portion of the sidewall 12a through the O-ring 19. The processing container is more securely sealed by the O-ring 19. The stage 14 is accommodated in the processing space S, and a workpiece is placed thereon. The dielectric window 20 has a facing surface 20a that faces the processing space S.

The PLL oscillator 16 oscillates a microwave of, for example, 2.45 GHz. The PLL oscillator 16 corresponds to an example of the microwave oscillator. The microwave oscillated by the PLL oscillator 16 is an example of the high frequency wave.

In the first exemplary embodiment, the plasma processing apparatus 1 further includes a microwave amplifier 21, a waveguide 22, an isolator 23, a detector 24, a detector 25, a tuner 26, a mode converter 27, and a coaxial waveguide 28.

The PLL oscillator 16 is connected to the waveguide 22 via the microwave amplifier 21. The microwave amplifier 21 amplifies the microwave oscillated by the PLL oscillator 16, and outputs the amplified microwave to the waveguide 22. The waveguide 22 is, for example, a rectangular waveguide. The waveguide 22 is connected to the mode converter 27, and the mode converter 27 is connected to the upper end of the coaxial waveguide 28.

The isolator 23 is connected to the waveguide 22 via a directional coupler 23a. The directional coupler 23a extracts a reflected wave of the microwave that is reflected from the processing container 12 side, and outputs the extracted reflected wave of the microwave to the isolator 23. The isolator 23 converts the reflected wave of the microwave that is input from the directional coupler 23a, into heat by, for example, load.

The detector 24 is connected to the waveguide 22 via the directional coupler 24a. The directional coupler 24a extracts a progressive wave of the microwave that is directed to the processing container 12 side, and outputs the extracted progressive wave of the microwave to the detector 24. The detector 24 detects a power of the progressive wave of the microwave that is input from the directional coupler 24a, and outputs the detected power of the progressive wave to the control unit 100.

The detector 25 is connected to the waveguide 22 via a directional coupler 25a. The directional coupler 25a extracts a reflected wave of the microwave that is reflected from the processing container 12 side, and outputs the extracted reflected wave of the microwave to the detector 25. The detector 25 detects a power of the reflected wave of the microwave that is input from the directional coupler 25a, and outputs the detected power of the reflected wave to the control unit 100.

The tuner 26 is provided in the waveguide 22, and has a function to match the impedance between the PLL oscillator 16 and the processing container 12. The tuner 26 includes movable plates 26a, 26b provided to protrude into the inner space of the waveguide 22. The tuner 26 controls the protruding positions of the movable plates 26a, 26b based on a reference position to match the impedance between the PLL oscillator 16 and the processing container 12.

The coaxial waveguide 28 extends along the axis X. The coaxial waveguide 28 includes an outer conductor 28a and an inner conductor 28b. The outer conductor 28a has a substantially cylindrical shape that extends in the axis X direction. The inner conductor 28b is provided inside the outer conductor 28a. The inner conductor 28b has a substantially cylindrical shape that extends along the axis X.

The microwave generated by the PLL oscillator 16 is guided to the mode converter 27 via the tuner 26 and the waveguide 22. The mode converter 27 converts the mode of the microwave, and supplies the mode-converted microwave to the coaxial waveguide 28. The microwave from the coaxial waveguide 28 is supplied to the antenna 18.

The antenna 18 radiates a microwave for plasma excitation, based on the microwave generated by the PLL oscillator 16. The antenna 18 includes a slot plate 30, a dielectric plate 32, and a cooling jacket 34. The antenna 18 is provided on a surface 20b opposite to the facing surface 20a of the dielectric window 20, and radiates the microwave for plasma excitation to the processing space S through the dielectric window 20, based on the microwave generated by the PLL oscillator 16. Meanwhile, the PLL oscillator 16 and the antenna 18 correspond to an example of the high frequency wave supply unit that supplies a high frequency wave (electronic energy) for converting a processing gas, which is introduced into the processing space S, into plasma.

The slot plate 30 is formed in a substantially disc shape of which the plate surface is orthogonal to the axis X. The slot plate 30 is disposed on the surface 20b opposite to the facing surface 20a of the dielectric window 20 so as to match the plate surface with that of the dielectric window 20. In the slot plate 30, a plurality of slots 30a are arranged circumferentially around the axis X. The slot plate 30 is a slot plate constituting a radial line slot antenna. The slot plate 30 is formed of a conductive metal in a disc shape. The slot plate 30 includes a plurality of slots 30a formed therein. Further, the slot plate 30 includes a through-hole 30d formed in the central portion, which is penetrable with a conduit 36 (to be described later).

The dielectric plate 32 is formed in a substantially disc shape of which the plate surface is orthogonal to the axis X. The dielectric plate 32 is provided between the slot plate 30 and the lower side surface of the cooling jacket 34. The dielectric plate 32 is made of, for example, quartz, and has a substantially disc shape.

The surface of the cooling jacket 34 has conductivity. The cooling jacket 34 includes a flow path 34a formed therein to allow a coolant to flow therethrough, so that the dielectric plate 32 and the slot plate 30 are cooled by the flow of the coolant. The upper surface of the cooling jacket 34 is electrically connected with the lower end of the outer conductor 28a. Further, the lower end of the inner conductor 28b passes through a hole formed in the central portion of the cooling jacket 34 and the dielectric plate 32, and electrically connected to the slot plate 30.

The microwave from the coaxial waveguide 28 is propagated to the dielectric plate 32, and introduced into the processing space S from the slots 30a of the slot plate 30 through the dielectric window 20. In the first exemplary embodiment, the conduit 36 passes through an inner hole of the inner conductor 28b of the coaxial waveguide 28. Further, the slot plate 30 includes a through-hole 30d formed in the central portion, through which the conduit 36 may extend. The conduit 36 extends along the axis X, and is connected to a gas supply system 38.

The gas supply system 38 supplies a processing gas for processing the workpiece W, to the conduit 36. The gas supply system 38 may include a gas source 38a, a valve 38b, and a flow rate controller 38c. The gas source 38a is a gas source of the processing gas. The valve 38b switches the supply of the processing gas from the gas source 38a and the stop of the supply. The flow rate controller 38c is, for example, a mass flow controller, and adjusts a flow rate of the processing gas from the gas source 38a. Meanwhile, the gas supply system 38 corresponds to an example of a gas supply mechanism that introduces a processing gas used in a plasma reaction to the processing space S.

In the first exemplary embodiment, the plasma processing apparatus 1 may further include an injector 41. The injector 41 supplies the gas from the conduit 36 to a through-hole 20h formed in the dielectric window 20. The gas supplied to the through-hole 20h of the dielectric window 20 is supplied to the processing space S. In the following description, the gas supply path constituted by the conduit 36, the injector 41, and the through-hole 20h may be referred to as a "central gas introduction unit" in some cases.

The stage 14 is provided to face the dielectric window 20 in the axis X direction. The stage 14 is provided such that the processing space S is interposed between the dielectric window 20 and the stage 14. The workpiece W is placed on the stage 14. In the first exemplary embodiment, the stage 14 includes a stand 14a, a focus ring 14ab, and an electrostatic chuck 14c. The stage 14 corresponds to an example of the placing table.

The stand 14a is supported by a cylindrical support 48. The cylindrical support 48 is made of an insulating material, and extends vertically upwardly from the bottom portion 12b. Further, a cylindrical conductive support 50 is provided on the outer periphery of the cylindrical support 48. The cylindrical support 50 extends vertically upwardly from the bottom portion 12b along the outer periphery of the cylindrical support 48. An annular exhaust path 51 is formed between the cylindrical support 50 and the sidewall 12a.

An annular baffle plate 52 foil led with a plurality of through-holes is attached to the upper portion of the exhaust path 51. An exhaust device 56 is connected to the lower portion of the exhaust hole 12h via an exhaust pipe 54. The exhaust device 56 includes an automatic pressure control valve (APC) and a vacuum pump such as, for example, a turbo molecular pump. The processing space S in the processing container 12 may be decompressed to a desired vacuum degree by the exhaust device 56.

The stand 14a also serves as a high frequency electrode. The stand 14a is electrically connected with a high frequency power source 58 for RF bias via a power feeding rod 62 and a matching unit 60. The high frequency power source 58 outputs a high frequency wave of a constant frequency suitable for controlling the energy of the ions drawn into the workpiece W, for example, 13.65 MHz at a predetermined power. The high frequency output by the high frequency power source 58 is an example of the second high frequency wave. The high frequency power source 58 detects a power of the reflected wave of the high frequency wave, and outputs the detected power of the reflected wave of the high frequency to the control unit 100.

The matching unit 60 accommodates a matcher for matching between the impedance of the high frequency power source 58 side and the impedance of the load side such as, mainly, the electrode, the plasma, and the processing container 12. A blocking capacitor for self-bias generation is included in the matcher.

The electrostatic chuck 14c is provided on the top surface of the stand 14a. The electrostatic chuck 14c holds the workpiece W by an electrostatic attraction force. The focus ring 14b is provided radially outside the electrostatic chuck 14c to annularly surround the periphery of the workpiece W. The electrostatic chuck 14c includes an electrode 14d, an insulating film 14e, and an insulating film 14f. The electrode 14d is formed of a conductive film, and provided between the insulating film 14e and the insulating film 14f. The electrode 14d is electrically connected with a high-voltage DC power source 64 via a switch 66 and a coated wire 68. The electrostatic chuck 14c may attract and hold the workpiece W by a Coulomb force generated by the DC voltage applied from the DC power source 64.

A circumferentially extending annular coolant chamber 14g is provided inside the stand 14a. In the coolant chamber 14g, a coolant of a predetermined temperature, for example, cooling water is circularly supplied from a chiller unit (not illustrated) through pipes 70, 72. The temperature of the top surface of the electrostatic chuck 14c is controlled by the temperature of the coolant. A heat transfer gas, for example, helium (He) gas is supplied between the top surface of the electrostatic chuck 14c and the rear surface of the workpiece W through a gas supply pipe 74, and the temperature of the workpiece W is controlled by the temperature of the top surface of the electrostatic chuck 14c.

In the first exemplary embodiment, the plasma processing apparatus 1 further includes a spectroscopic sensor 80. The spectroscopic sensor 80 detects a luminous intensity of plasma having a specific wavelength inside the processing container 12, and outputs the detected luminous intensity of the plasma to the control unit 100.

The control unit 100 is connected to respective parts constituting the plasma processing apparatus 1, and collectively controls the respective parts. The control unit 100 includes a controller 101 provided with a central processing unit (CPU), a user interface 102, and a storage unit 103.

The controller 101 collectively controls the respective parts of the plasma processing apparatus 1 by executing a program and a processing recipe stored in the storage unit 103.

The user interface 102 includes, for example, a keyboard or a touch panel for inputting, for example, commands by a process manager to manage the plasma processing apparatus 1, and a display for visually displaying the operation status of the plasma processing apparatus 1.

The storage unit 103 stores a control program (software) for realizing various processings performed in the plasma processing apparatus 1 by the control of the controller 101, or recipe for executing a process, in which a processing condition data is recorded. When the controller 101 reads out various control programs from the storage unit 103 as necessary, for example, according to instructions from the user interface 102, and the control programs are executed by the controller 101, a desired processing is performed in the plasma processing apparatus 1 under the control of the controller 101. Further, the control program or the recipe of the processing condition data may be used in a state of being stored in a computer-readable computer storage medium (e.g., a hard disc, a CD, a flexible disc, or a semiconductor memory), or may be used on-line by being transmitted at any time from other devices, for example, through a dedicated line.

For example, the control unit 100 controls the respective parts of the plasma processing apparatus 1 to perform the processing condition producing method of the plasma processing apparatus 1 (to be described later). As a detailed example, the control unit 100 produces a plurality of processing conditions having different processing parameters, which are applied to an intermediate process performed between an ignition process that ignites plasma of a processing gas using a microwave and a processing process that processes a workpiece by the plasma. Then, the control unit 100 sequentially performs the ignition process, the intermediate process applied with each of the processing conditions, and the processing process. Then, the control unit 100 measures, when the intermediated process is changed to the processing process, a power of a reflected wave of the high frequency wave during the processing process in association with each of the processing conditions. Then, the control unit 100 selects, among the plurality of processing conditions, a processing condition in which the power of the reflected wave of the microwave is minimized. Here, the power of the reflected wave of the microwave is set to a power of a reflected wave of a microwave detected by, for example, the detector 25. Further, the processing parameter is a parameter that is a factor of varying a power of a reflected wave of a high frequency wave such as, for example, a microwave. The processing parameter is at least one of, for example, a pressure inside the processing container 12 to which the microwave is radiated, a kind of the processing gas, a flow rate of the processing gas, a power of the microwave, a frequency of the microwave, a power of a high frequency wave supplied to the stage 14, a frequency of the high frequency wave, and a processing time.

Figure 2A:
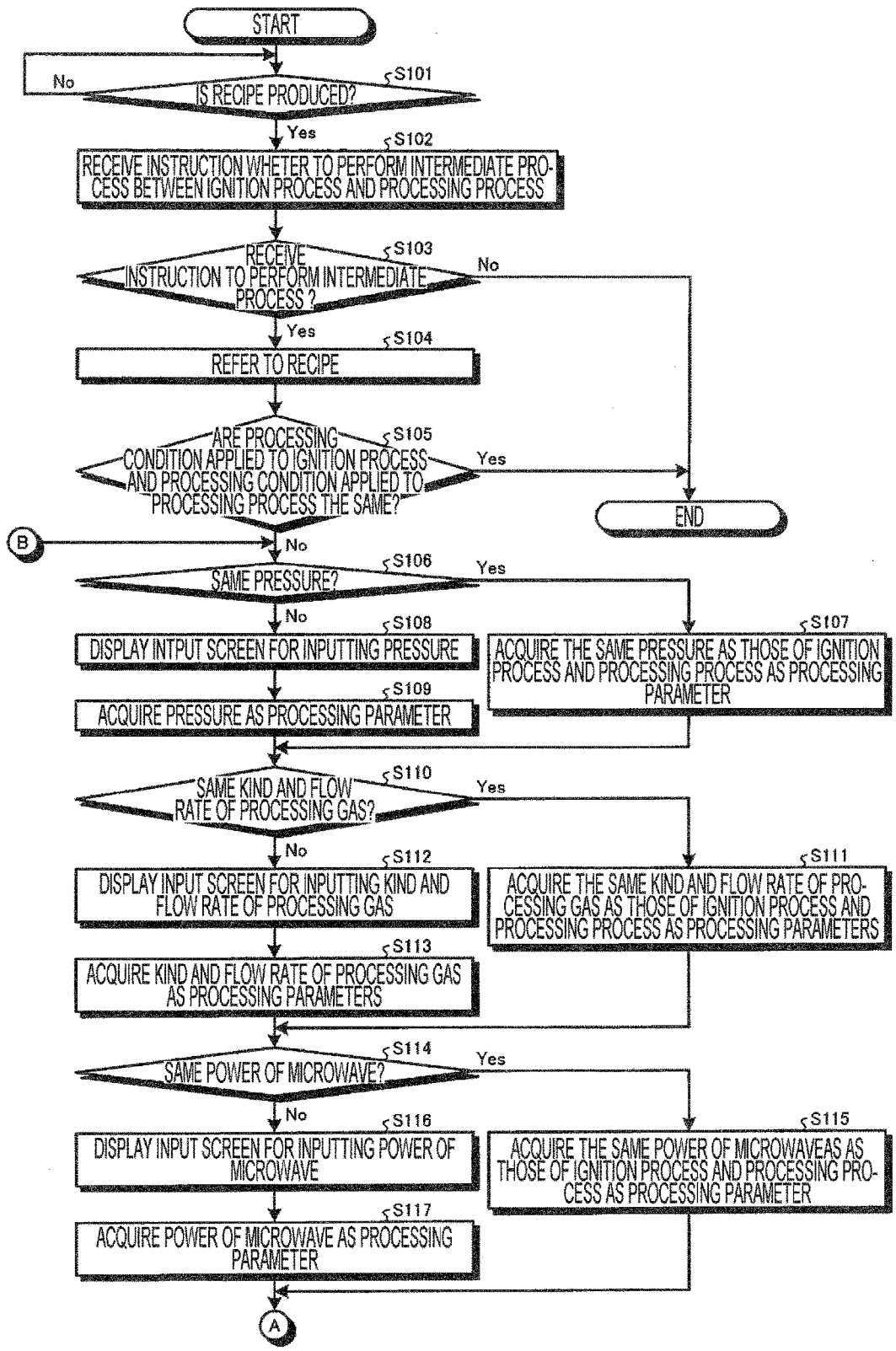
FIG. 2A is a flowchart illustrating an exemplary processing condition producing processing flow of a processing condition producing method according to the first exemplary embodiment.
Figure 2B:
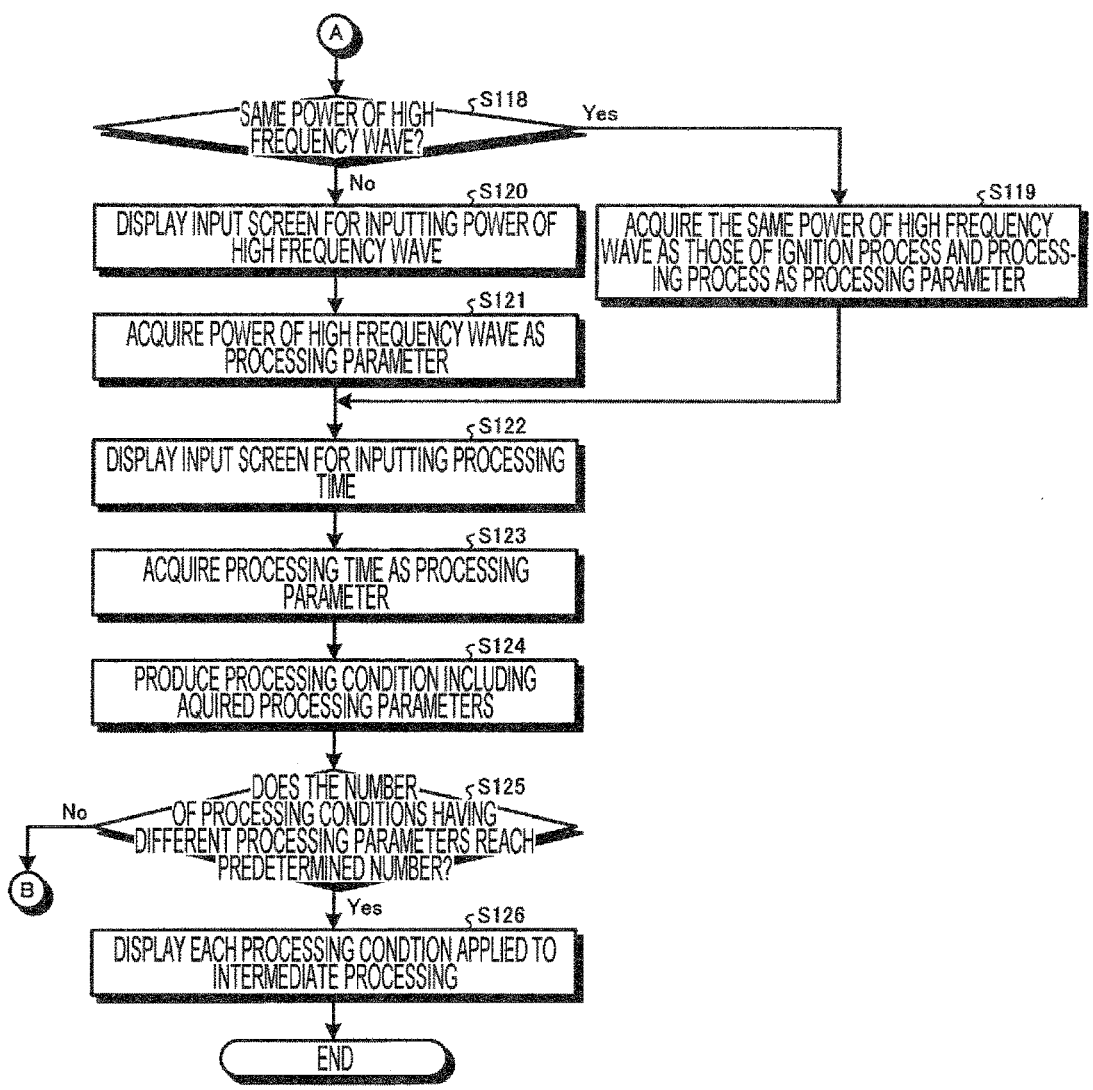
FIG. 2B is a flowchart illustrating an exemplary processing condition producing processing flow of a processing condition producing method according to the first exemplary embodiment.

Next, the processing condition producing method of the plasma processing apparatus 1 according to the first exemplary embodiment will be described. FIGS. 2A and 2B are flowcharts illustrating an exemplary processing condition producing processing flow of the processing condition producing method according to the first exemplary embodiment. Meanwhile, the processing condition producing processing is a processing which is applied to the intermediate process, and produces a plurality of processing conditions having different processing parameters.

As illustrated in FIGS. 2A and 2B, when a recipe for performing a process is produced (step S101, Yes), the control unit 100 of the plasma processing apparatus 1 receives an instruction whether to perform the intermediate process between the ignition process and the processing process, through the user interface 102 (step S102). Here, it is assumed that a recipe illustrated in FIG. 3 is produced.

FIG. 3 is a view illustrating an exemplary recipe. As illustrated in FIG. 3, the recipe manages a plurality of consecutive processes for performing the processing in association with the processing conditions associated with respective processes. In FIG. 3, the item "Gas Supply Process" refers to a process of supplying a processing gas used in a plasma reaction, into the processing container 12. The item "Ignition Process" refers to a process of igniting plasma of the processing gas using a microwave. The item "Processing Process" refers to a process of performing a plasma processing on a workpiece by the plasma of the processing gas.

Further, in FIG. 3, the item "Process Content" represents a processing content of each process. The item "Time (sec)" represents a processing time in each process. The item "Pressure (mTorr)" represents a pressure in the processing container 12 in each process. The item "MW (W)" represents a power of the microwave output from the PLL oscillator 16 in each process. The item "RF (W)" represents a power of the high frequency wave supplied from the high frequency power source 58 to the stage 14, in each process. The item "Gas" represents the kind and the flow rate of a processing gas in each process. Meanwhile, the items "Pressure (mTorr)," "MW (W)," "RF (W)," and "Gas" correspond to the processing parameters included in the processing condition associated with each process.

The descriptions will refer back to FIGS. 2A and 2B. When the control unit 100 does not receive an instruction to perform the intermediate process between the ignition process and the processing process (step S103, No), the control unit 100 terminates the processing.

Meanwhile, when the control unit 100 receives the instruction to perform the intermediate process between the ignition process and the processing process (step S103, Yes), the control unit 100 refers to the produced recipe (step S104), and determines whether the processing condition applied to the ignition process and the processing condition applied to the processing process are the same (step S105). Meanwhile, when the processing condition applied to the ignition process and the processing condition applied to the processing process are the same, it indicates that the processing parameters in the ignition process and the processing parameters in the processing process are all the same.

When the processing condition applied to the ignition process and the processing condition applied to the processing process are the same (step S105, Yes), the control unit 100 terminates the processing because it is not necessary to perform the intermediate process.

On the other hand, when the processing condition applied to the ignition process and the processing condition applied to the processing process are not the same (step S105, No), the control unit 100 allows the processing to proceed to step S106 because it is necessary to perform the intermediate process.

The control unit 100 determines whether the pressure in the processing container 12 in the ignition process and the pressure in the processing container 12 in the processing process are the same (step S106). When the pressure in the processing container 12 in the ignition process and the pressure in the processing container 12 in the processing process are the same (step S106, Yes), the control unit 100 acquires, as a processing parameter, the pressure that is the same as those in the ignition process and the processing process (step S107).

On the other hand, when the pressure in the processing container 12 in the ignition process and the pressure in the processing container 12 in the processing process are not the same (step S106, No), the control unit 100 displays an input screen for inputting a pressure in the processing container 12 in the intermediate process on the user interface 102 (step S108).

FIG. 4 is a view illustrating an exemplary input screen for inputting a pressure inside a processing container in an intermediate process. As illustrated in FIG. 4, the input screen receives, as a pressure in the processing container 12 in the intermediate process, an input of a pressure (e.g., 60 mTorr) in the middle of the pressure in the processing container 12 in the ignition process (e.g., 100 mTorr) and the pressure in the processing container 12 in the processing process (e.g., 20 mTorr). Further, the input screen receives an input of a pressure every 10 mTorr (e.g., 90, 80, . . . , 30 mTorr) in a range from the pressure in the processing container 12 in the ignition process (e.g., 100 mTorr) to the pressure in the processing container 12 in the processing process (e.g., 20 mTorr). Further, the input screen receives an input of a pressure every 5 mTorr (e.g., 95, 90, . . . , 25 mTorr) in a range from the pressure in the processing container 12 in the ignition process (e.g., 100 mTorr) to the pressure in the processing container 12 in the processing process (e.g., 20 mTorr). Further, the input screen receives an input of an arbitrary pressure.

The descriptions will refer back to FIGS. 2A and 2B. The control unit 100 acquires, as a processing parameter, the pressure input in the input screen (step S109).

Subsequently, the control unit 100 determines whether the kind and the flow rate of the processing gas in the ignition process and the kind and the flow rate of the processing gas in the processing process are the same (step S110). When the kind and the flow rate of the processing gas in the ignition process and the kind and the flow rate of the processing gas in the processing process are the same (step S110, Yes), the control unit 100 acquires, as processing parameters, the kind and the flow rate of the processing gas which are the same as those in the ignition process and the processing process (step S111).

On the other hand, when the kind and the flow rate of the processing gas in the ignition process and the kind and the flow rate of the processing gas in the processing process are not the same (step S110, No), the control unit 100 displays an input screen for inputting a kind and a flow rate of the processing gas in the intermediate process on the user interface 102 (step S112).

FIG. 5 is a view illustrating an exemplary input screen for inputting a kind and a flow rate of a processing gas in the intermediate process. As illustrated in FIG. 5, the input screen receives, as the kind and the flow rate of the processing gas in the intermediate process, the kind of the processing gas obtained by combining the kind of the processing gas in the ignition process (e.g., $O_2$/Ar) and the kind of the processing gas in the processing process (e.g., $O_2$), and the flow rate thereof. Further, the input screen receives input of a kind of an arbitrary processing gas and a flow rate thereof.

The descriptions will refer back to FIGS. 2A and 2B. The control unit 100 acquires, as processing parameters, the kind and the flow rate of the processing gas input in the input screen (step S113).

Subsequently, the control unit 100 determines whether the power of the microwave in the ignition process and the power of the microwave in the processing process are the same (step S114). When the power of the microwave in the ignition process and the power of the microwave in the processing process are the same (step S114, Yes), the control unit 100 acquires, as a processing parameter, the power of the microwave that is the same as those in the ignition process and the processing process (step S115).

On the other hand, when the power of the microwave in the ignition process and the power of the microwave in the processing process are not the same (step S114, No), the control unit 100 displays an input screen for inputting a power of the microwave in the intermediate process on the user interface 102 (step S116).

FIG. 6 is a view illustrating an exemplary input screen for inputting a power of a microwave in the intermediate process. As illustrated in FIG. 6, the input screen receives, as a power of the microwave in the intermediate process, the power of the microwave (e.g., 2,000 W) that is the same as that in the ignition process. Further, the input screen receives, as a power of the microwave in the intermediate process, a power (2,500 W) in the middle of the power of the microwave in the ignition process (e.g., 2,000 W) and the power of the microwave in the processing process (e.g., 3,000 W). Further, the input screen receives, as a power of the microwave in the intermediate process, a power of the microwave in the processing process (e.g., 3,000 W). Further, the input screen receives input of an arbitrary power of the microwave.

The descriptions will refer back to FIGS. 2A and 2B. The control unit 100 acquires, as a processing parameter, the power of the microwave input in the input screen (step S117).

Subsequently, the control unit 100 determines whether the power of the high frequency wave in the ignition process and the power of the high frequency wave in the processing process are the same (step S118). When the power of the high frequency wave in the ignition process and the power of the high frequency wave in the processing process are the same (step S118, Yes), the control unit 100 acquires, as a processing parameter, the power of the high frequency wave that is the same as those in the ignition process and the processing process (step S119).

On the other hand, when the power of the high frequency wave in the ignition process and the power of the high frequency wave in the processing process are not the same (step S118, No), the control unit 100 displays an input screen for inputting a power of the high frequency wave in the intermediate process (step S120).

The control unit 100 acquires, as a processing parameter, the power of the high frequency wave input in the input screen (step S121).

Subsequently, the control unit 100 displays an input screen for inputting a processing time in the intermediate process (step S122).

FIG. 7 is a view illustrating an exemplary input screen for inputting a processing time in the intermediate process. As illustrated in FIG. 7, the input screen receives, as a processing time in the intermediate process, the processing time (e.g., 2 seconds) that is the same as that in the ignition process. Further, the input screen receives, as a processing time in the intermediate process, an input of a processing time within a range from the processing time in the ignition process (e.g., 2 seconds) to the processing time in the processing process (e.g., 2.5 seconds or 3 seconds). Further, the input screen receives an input of an arbitrary processing time.

The descriptions will refer back to FIGS. 2A and 2B. The control unit 100 acquires, as a processing parameter, the processing time input in the input screen (step S123).

The control unit 100 produces a processing condition including the acquired processing parameters (step S124). The produced processing condition is stored in the storage unit 103.

The control unit 100 refers to the storage unit 103, and determines whether the number of a plurality of processing conditions having different processing parameters reach a predetermined number (step S125). When the number of a plurality of processing conditions having different processing parameters does not reach a predetermined number (step S125, No), the control unit 100 returns the processing to step S106, and initiates generation of a new processing condition. In this manner, the control unit 100 is applied to the intermediate process, and produces a plurality of processing conditions having different processing parameters.

On the other hand, when the number of a plurality of processing conditions having different processing parameters reach a predetermined number (step S125, Yes), the control unit 100 displays each processing condition applied to the intermediate process on the user interface 102, as necessary (step S126), and terminates the processing.

FIG. 8 is a view illustrating exemplary processing conditions produced by the processing condition producing processing. As illustrated in FIG. 8, it is assumed that four processing conditions different in the flow rate of the processing gas as a processing parameter, that is, Processing Conditions #1 to #4 are produced by the processing condition producing processing.

Figure 9:
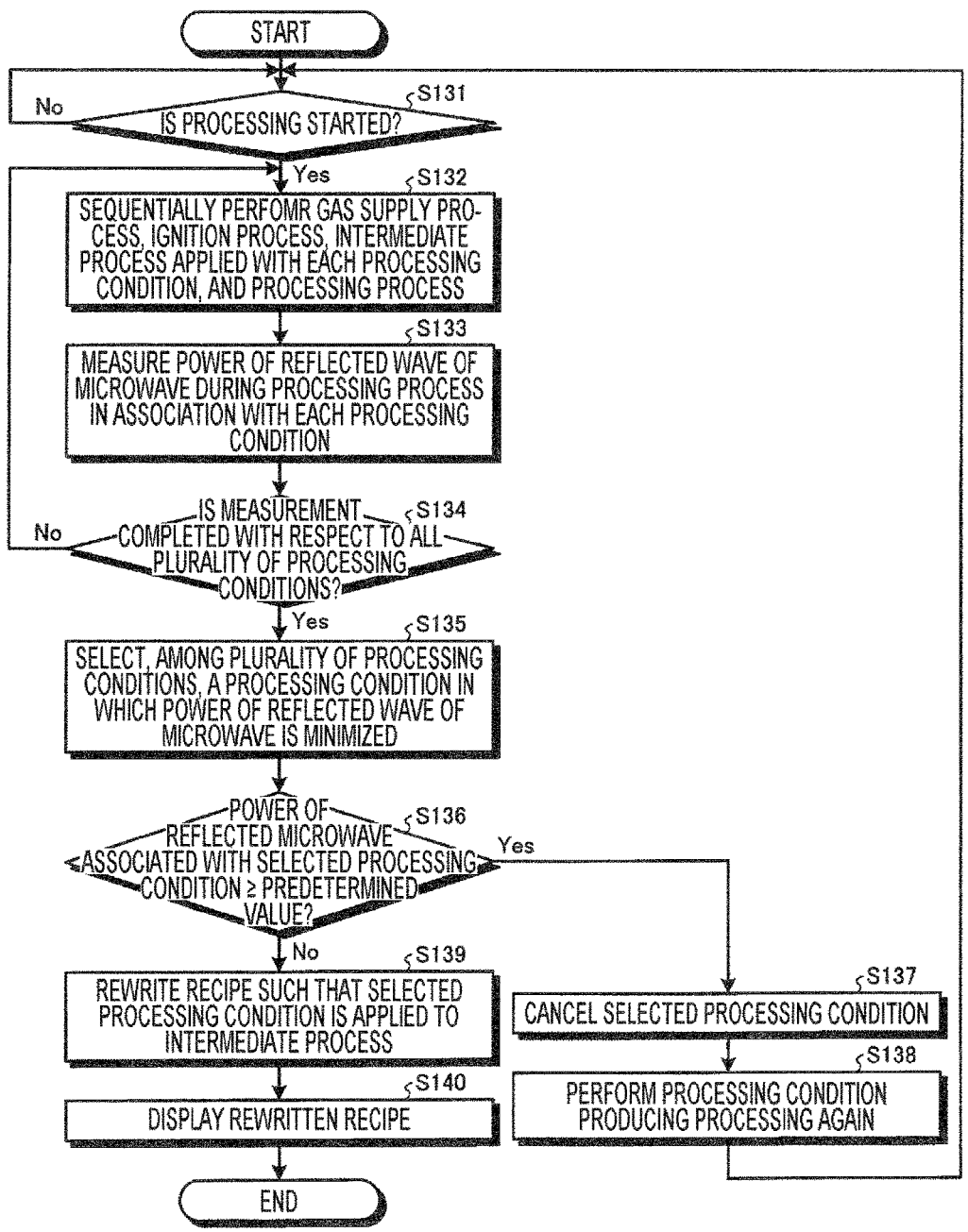
FIG. 9 is a flowchart illustrating an exemplary processing condition selecting processing flow of the processing condition producing method according to the first exemplary embodiment.

Next, descriptions will be made on a processing condition selecting processing that automatically selects the optimal processing condition among the plurality of processing conditions. FIG. 9 is a flowchart illustrating an exemplary processing condition selecting processing flow of the processing condition producing method according to the first exemplary embodiment. The processing condition selecting processing illustrated in FIG. 9 is started by pressing a processing condition selecting processing start button displayed on the user interface 102.

As illustrated in FIG. 9, when the processing is started (step S131, Yes), the control unit 100 of the plasma processing apparatus 1 sequentially performs the gas supply process, the ignition process, the intermediate process applied with each of the processing conditions, and the processing process (step S132).

The control unit 100 measures, when the intermediated process is changed to the processing process, a power of a reflected wave of the high frequency wave during the processing process in association with each of the processing conditions (step S133). Meanwhile, in the period from the ignition process to the processing process, the power of the reflected wave of the microwave may be measured and stored in a predetermined memory.

When the measurement of the power of the reflected wave of the microwave is not completed with respect to all the plurality of processing conditions (step S134, No), the control unit 100 returns the processing to step S132.

On the other hand, when the measurement of the power of the reflected wave of the microwave is completed with respect to all the plurality of processing conditions (step S134, Yes), the control unit 100 selects, among the plurality of processing conditions, a processing condition in which the power of the reflected wave of the microwave is minimized (step S135).

Figure 10:
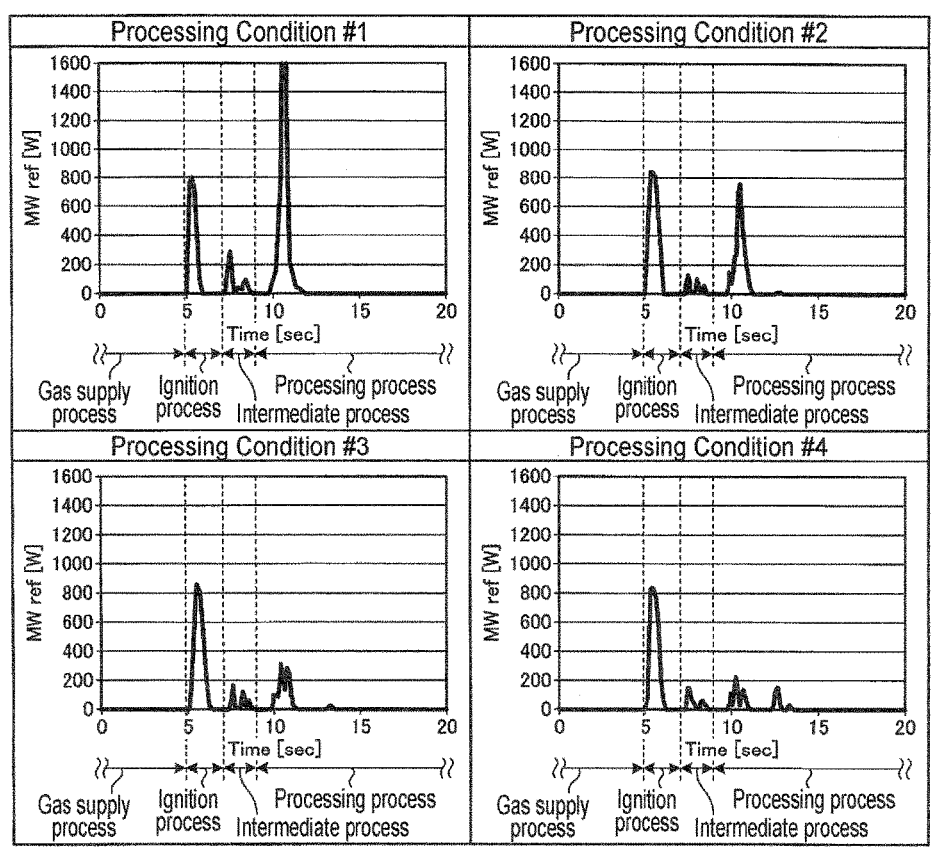
FIG. 10 is a view illustrating an exemplary measurement result of a power of a reflected wave of a microwave associated with respective processing conditions.

Here, descriptions will be made on an exemplary processing in which the control unit 100 selects a processing condition. FIG. 10 is a view illustrating an exemplary measurement result of a power of a reflected wave of a microwave associated with respective processing conditions. FIG. 10 illustrates measurement results of the power of the reflected wave of the microwave, corresponding to Processing Conditions #1 to #4 illustrated in FIG. 8, respectively. In the measurement results illustrated in FIG. 10, the horizontal axis represents a time (sec), and the vertical axis represents a power of the reflected wave of the microwave (W).

As is obvious from the measurement results illustrated in FIG. 10, among the powers of the reflected wave of the microwave measured in association with each of the processing conditions, the power of the reflected wave of the microwave measured in association with Processing Condition #4 is minimized. In this case, the control unit 100 selects, among Processing Conditions #1 to #4, Processing Condition #4 in which the power of the reflected wave of the microwave is minimized.

The descriptions will refer back to FIG. 9. The control unit 100 determines whether the power of the reflected wave of the microwave associated with the selected processing condition is equal to or larger than a predetermined value (step S136). Here, the predetermined value may be an arbitrary value. For example, the value may be set to 10% of the power of the progressive wave of the microwave.

When the power of the reflected wave of the microwave associated with the selected processing condition is equal to or larger than the predetermined value (step S136, Yes), the control unit 100 cancels the selected processing condition (step S137), and performs the processing condition producing processing illustrated in FIGS. 2A and 2B again (step S138). Then, the control unit 100 returns the processing to step S131.

When the power of the reflected wave of the microwave associated with the selected processing condition is less than the predetermined value (step S136, No), the control unit 100 rewrites a recipe such that the selected processing condition is applied to the intermediate process (step S139). Then, the control unit 100 displays the rewritten recipe on the user interface 102 as necessary (step S140), and terminates the processing.

As described above, the plasma processing apparatus 1 according to the first exemplary embodiment produces a plurality of processing conditions having different processing parameters, which are applied to the intermediate process performed between the ignition process and the processing process, and selects, among the plurality of processing conditions, a processing condition in which the power of the reflected wave of the high frequency wave is minimized. Accordingly, it is unnecessary to prepare a plurality of processing conditions and apply each of the processing conditions to the intermediate process, thereby performing evaluation. As a result, according to the first exemplary embodiment, it is possible to automatically produce an appropriate processing condition that suppresses reflection of the microwave.

Second Exemplary Embodiment

The second exemplary embodiment is different from the first exemplary embodiment in the manner of selecting a processing condition. Therefore, in the following, descriptions will be focused on the manner of selecting a processing condition.

In the plasma processing apparatus 1 according to the second exemplary embodiment, the control unit 100 measures, when the intermediated process is changed to the processing process, a power of a reflected wave of the microwave during the processing process and a luminous intensity of plasma in association with each of the processing conditions. Then, the control unit 100 selects, among the plurality of processing conditions, a processing condition in which the power of the reflected wave of the microwave is minimized. Then, when the luminous intensity of the plasma associated with the selected processing condition is less than a predetermined value, the control unit 100 cancels the processing condition. Here, the luminous intensity of the plasma is set to a luminous intensity of the plasma detected by the spectroscopic sensor 80.

Figure 11:
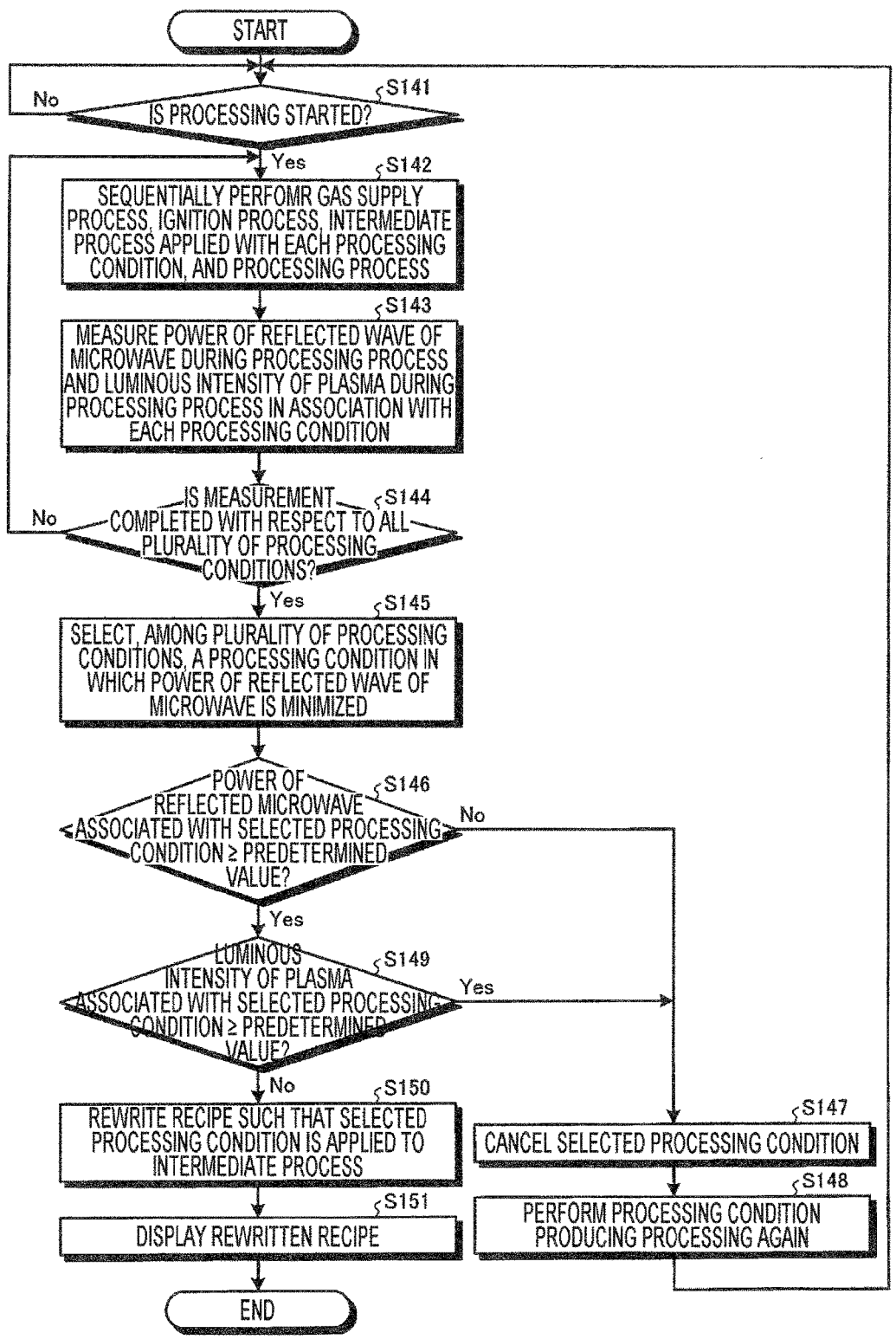
FIG. 11 is a flowchart illustrating an exemplary processing condition selecting processing flow of a processing condition producing method according to a second exemplary embodiment.

FIG. 11 is a flowchart illustrating an exemplary processing condition selecting processing flow of a processing condition producing method according to the second exemplary embodiment. The processing condition selecting processing illustrated in FIG. 11 is started by pressing a processing condition selecting processing start button displayed on the user interface 102.

As illustrated in FIG. 11, when the processing is started (step S141, Yes), the control unit 100 of the plasma processing apparatus 1 sequentially performs the gas supply process, the ignition process, the intermediate process applied with each of the processing conditions, and the processing process (step S142).

The control unit 100 measures, when the intermediated process is changed to the processing process, a power of a reflected wave of the microwave during the processing process and the luminous intensity of the plasma during the processing process in association with each of the processing conditions (step S143). Meanwhile, in the period from the ignition process to the processing process, the power of the reflected wave of the microwave and the luminous intensity of the plasma may be measured and stored in a predetermined memory.

When the measurement of the power of the reflected wave of the microwave and the luminous intensity of the plasma is not completed with respect to all the plurality of processing conditions (step S144, No), the control unit 100 returns the processing to step S142.

On the other hand, when the measurement of the power of the reflected wave of the microwave and the luminous intensity of the plasma is completed with respect to all the plurality of processing conditions (step S144, Yes), the control unit 100 selects, among the plurality of processing conditions, a processing condition in which the power of the reflected wave of the microwave is minimized (step S145).

When the luminous intensity of the plasma associated with the selected processing condition is less than a predetermined value (step S146, No), the control unit 100 cancels the selected processing condition (step S147), and performs the processing condition producing processing illustrated in FIGS. 2A and 2B again (step S148). Then, the control unit 100 returns the processing to step S141. On the other hand, when the luminous intensity of the plasma associated with the selected processing condition is equal to or larger than the predetermined value (step S146, No), the control unit 100 admits the selected processing condition and allows the processing to proceed to step S149. Meanwhile, in order to suppress the loss of the plasma, when the luminous intensity of the plasma during the intermediate process is less than the predetermined value, the selected processing condition may be canceled.

Figure 12:
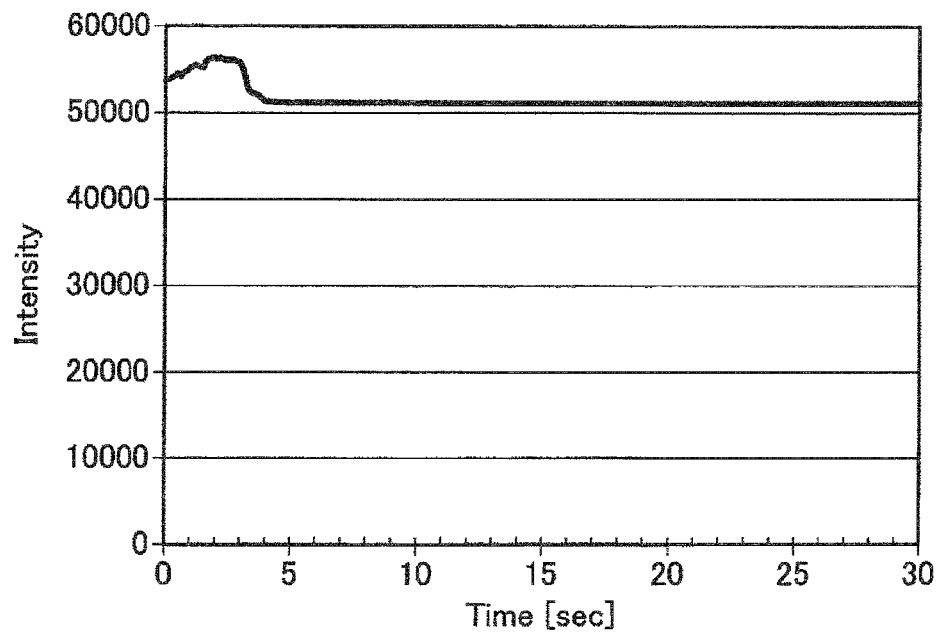
FIG. 12 is a view illustrating an exemplary luminous intensity of plasma during the performance of the processing process.
Figure 13:
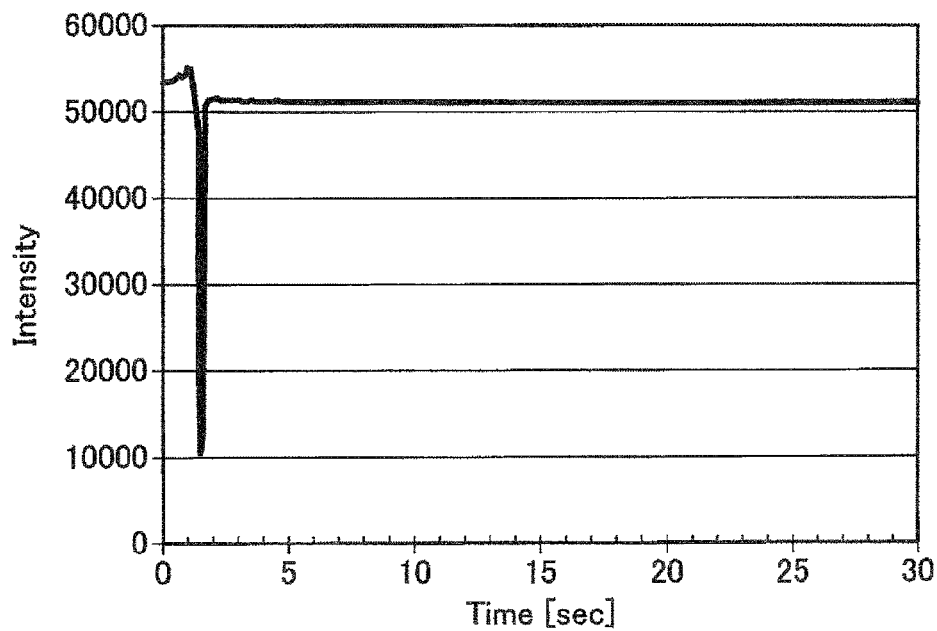
FIG. 13 is a view illustrating another exemplary luminous intensity of plasma during the performance of the processing process.

FIGS. 12 and 13 are views illustrating another exemplary luminous intensity of plasma during the performance of the processing process. In FIGS. 12 and 13, the horizontal axis represents a luminous intensity of plasma of oxygen gas during the processing process, and the vertical axis represents a time. As illustrated in FIG. 12, when the luminous intensity of the plasma during the processing process is equal to or larger than a predetermined value (e.g., 50,000), the processing condition is admitted. On the other hand, as illustrated in FIG. 13, when the luminous intensity of the plasma during the processing process is less than the predetermined value (e.g., 50,000), the processing condition is rejected and canceled.

The descriptions will refer back to FIG. 11. The control unit 100 determines whether the power of the reflected wave of the microwave associated with the selected processing condition is equal to or larger than a predetermined value (step S149). Here, the predetermined value may be an arbitrary value. For example, the value may be set to 10% of the power of the progressive wave of the microwave.

When the power of the reflected wave of the microwave associated with the selected processing condition is equal to or larger than the predetermined value (step S149, Yes), the control unit 100 allows the processing to proceed to step S147.

On the other hand, when the power of the reflected wave of the microwave associated with the selected processing condition is less than the predetermined value (step S149, No), the control unit 100 rewrites a recipe such that the selected processing condition is applied to the intermediate process (step S150). Then, the control unit 100 displays the rewritten recipe on the user interface 102 as necessary (step S151), and terminates the processing.

As described above, the plasma processing apparatus 1 according to the second exemplary embodiment selects, among the plurality of processing conditions, a processing condition in which the power of the reflected wave of the microwave is minimized, and when the luminous intensity of the plasma associated with the selected processing condition is less than the predetermined value, cancels the processing condition. As a result, according to the second exemplary embodiment, it is possible to automatically produce appropriate processing conditions that suppress the reflection of the microwave and maintain the luminous intensity of the plasma.

Third Exemplary Embodiment

The third exemplary embodiment is different from the first exemplary embodiment in the manner of selecting a processing condition. Therefore, in the following, descriptions will be focused on the manner of selecting a processing condition.

In the plasma processing apparatus 1 according to the third exemplary embodiment, the control unit 100 measures, when the intermediated process is changed to the processing process, a power of a reflected wave of the microwave during the processing process and a power of a reflected wave of the high frequency wave during the processing process in association with each of the processing conditions. Then, the control unit 100 selects, among the plurality of processing conditions, a processing condition in which the power of the reflected wave of the microwave is minimized and the power of the reflected wave of the high frequency wave is minimized. Here, the power of the reflected wave of the high frequency wave is set to a power of a reflected wave of a high frequency wave detected by, for example, the detector 58.

Figure 14:
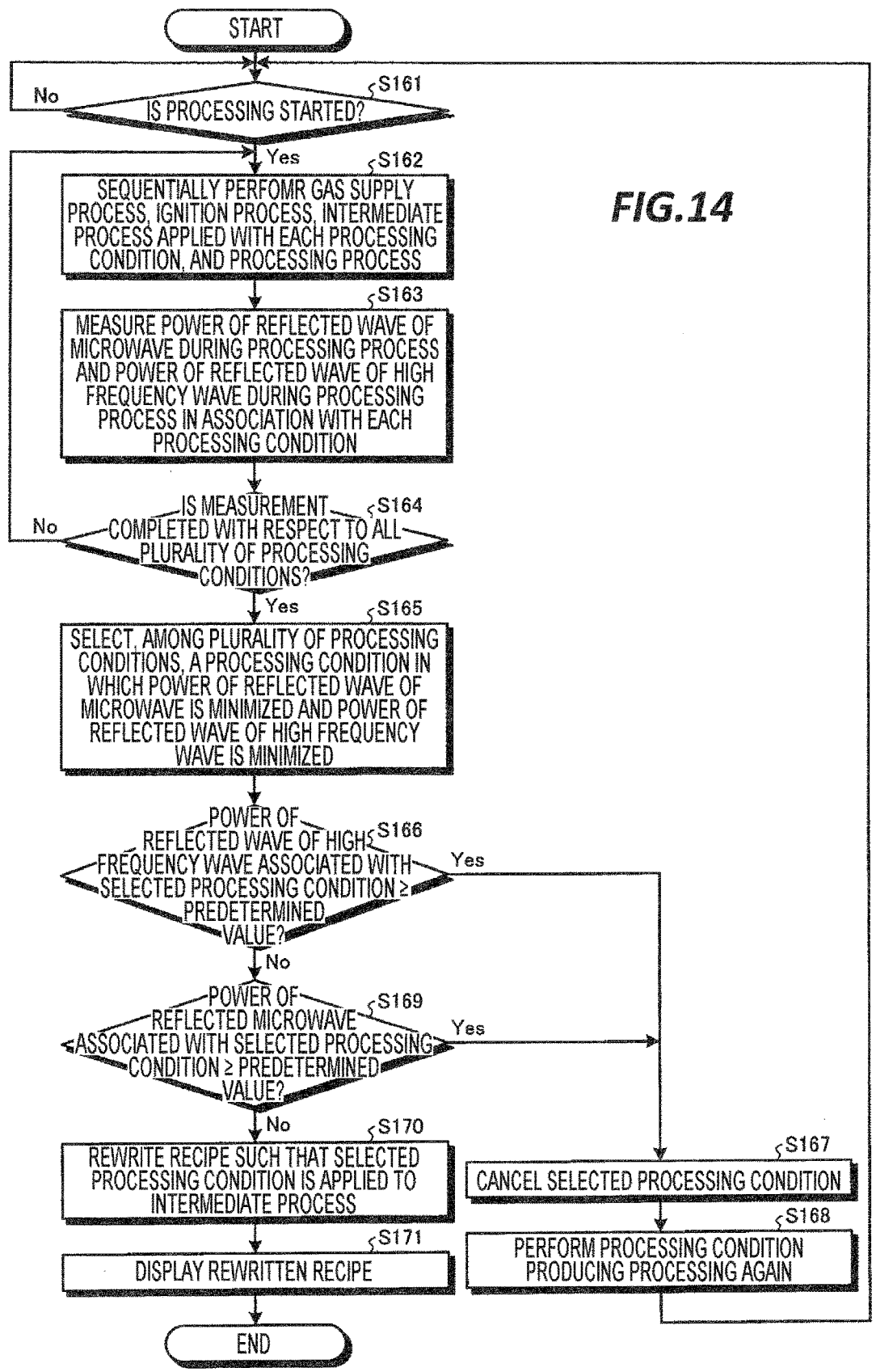
FIG. 14 is a flowchart illustrating an exemplary processing condition selecting processing flow of a processing condition producing method according to a third exemplary embodiment.

FIG. 14 is a flowchart illustrating an exemplary processing condition selecting processing flow of a processing condition producing method according to the third exemplary embodiment. The processing condition selecting processing illustrated in FIG. 14 is started by pressing a processing condition selecting processing start button displayed on the user interface 102.

As illustrated in FIG. 14, when the processing is started (step S161, Yes), the control unit 100 of the plasma processing apparatus 1 sequentially performs the gas supply process, the ignition process, the intermediate process applied with each of the processing conditions, and the processing process (step S162).

The control unit 100 measures, when the intermediated process is changed to the processing process, a power of a reflected wave of the microwave during the processing process and a power of a reflected wave of the high frequency wave during the processing process in association with each of the processing conditions (step S163).

When the measurement of the power of the reflected wave of the microwave and the power of the reflected wave of the high frequency wave is not completed with respect to all the plurality of processing conditions (step S164, No), the control unit 100 returns the processing to step S162.

On the other hand, when the measurement of the power of the reflected wave of the microwave and the power of the reflected wave of the high frequency wave is completed with respect to all the plurality of processing conditions (step S164, Yes), the control unit 100 selects, among the plurality of processing conditions, a processing condition in which the power of the reflected wave of the microwave is minimized and the power of the reflected wave of the high frequency wave is minimized (step S165).

When the power of the reflected wave of the microwave associated with the selected processing condition is equal to or larger than a predetermined value (step S166, Yes), the control unit 100 cancels the selected processing condition (step S167), and performs the processing condition producing processing illustrated in FIGS. 2A and 2B again (step S168). Then, the control unit 100 returns the processing to step S161. When the power of the reflected wave of the high frequency wave associated with the selected processing condition is less than the predetermined value (step S166, No), the control unit 100 allows the processing to proceed to step S169. Here, the predetermined value may be an arbitrary value. For example, the value may be set to 10% of the power of the high frequency wave.

The control unit 100 determines whether the power of the reflected wave of the microwave associated with the selected processing condition is equal to or larger than a predetermined value (step S169). Here, the predetermined value may be an arbitrary value. For example, the value may be set to 10% of the power of the progressive wave of the microwave.

When the power of the reflected wave of the microwave associated with the selected processing condition is equal to or larger than the predetermined value (step S169, Yes), the control unit 100 allows the processing to proceed to step S167.

On the other hand, when the power of the reflected wave of the microwave associated with the selected processing condition is less than the predetermined value (step S169, No), the control unit 100 rewrites a recipe such that the selected processing condition is applied to the intermediate process (step S170). Then, the control unit 100 displays the rewritten recipe on the user interface 102 as necessary (step S171), and terminates the processing.

As described above, the control unit 1 according to the third exemplary embodiment selects, among the plurality of processing conditions, a processing condition in which the power of the reflected wave of the microwave is minimized and the power of the reflected wave of the high frequency wave is minimized. As a result, according to the third exemplary embodiment, it is possible to automatically produce appropriate processing conditions that suppress the reflection of the microwave and the reflection of the high frequency wave.

Meanwhile, in the above descriptions, individual configurations and operations of respective exemplary embodiments have been described. However, the plasma processing apparatus 1 according to each exemplary embodiment may also include components specific to other exemplary embodiments. Further, the combination of each exemplary embodiment is not limited to combination of two, but may adopt any form such as, for example, combination of three or more thereof. For example, similarly to the plasma processing apparatus 1 according to the second exemplary embodiment, when the luminous intensity of the plasma associated with the selected processing condition is less than a predetermined value, the plasma processing apparatus 1 according to the third exemplary embodiment may cancel the selected processing condition, and perform the processing condition producing processing again. Further, one plasma processing apparatus 1 may include all components described in the first to third exemplary embodiments within a compatible range.

Further, in the above descriptions, in the ignition process, the microwave was used as an exemplary high frequency wave to ignite plasma of the processing gas, but the disclosed technique is not limited thereto. For example, the plasma processing apparatus may use a high frequency wave supplied to at least one of a pair of parallel flat plate type electrodes to ignite plasma of the processing gas. In short, the plasma processing apparatus may use a high frequency wave to ignite plasma of the processing gas.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method of producing a processing condition of a plasma processing apparatus, the method comprising:
   producing a plurality of processing conditions having different processing parameters, which are applied to an intermediate process performed between an ignition process that ignites plasma of a processing gas using a high frequency wave and a processing process that processes a workpiece by the plasma;
   sequentially performing the ignition process, the intermediate process applied with each of the processing conditions, and the processing process;
   measuring, when the intermediate process is changed to the processing process, a power of a reflected wave of the high frequency wave during the processing process in association with each of the processing conditions; and
   selecting, among the plurality of processing conditions, a processing condition in which the power of the reflected wave of the high frequency wave is minimized,
   wherein the plasma processing apparatus includes a storage unit configured to store a recipe used when the ignition process, the intermediate process, and the processing process are performed, and
   the selecting rewrites the recipe such that the selected processing condition is applied to the intermediate process.

2. The method of claim 1, wherein the plasma processing apparatus further includes a high frequency wave power source configured to supply a second high frequency wave that is different from the high frequency wave, to a placing table on which the workpiece is placed,
   the measuring measures, when the intermediate process is changed to the processing process, the power of the reflected wave of the high frequency wave during the processing process and a power of a reflected wave of the second high frequency wave during the processing process in association with each of the processing conditions, and
   the selecting selects, among the plurality of processing conditions, a processing condition in which the power of the reflected wave of the high frequency wave is minimized and the power of the reflected wave of the second high frequency wave is minimized.

3. The method of claim 1, wherein the measuring measures, when the intermediate process is changed to the processing process, the power of the reflected wave of the high frequency wave during the processing process and a luminous intensity of the plasma during the processing process in association with each of the processing conditions, and
   the selecting selects, among the plurality of processing conditions, a processing condition in which the power of the reflected wave of the high frequency wave is minimized, and when the luminous intensity of the plasma in association with the selected processing condition is less than a predetermined value, cancel the processing condition.

4. The method of claim 1, wherein the processing parameter is at least one selected from a pressure inside a processing container to which the high frequency wave is radiated, a kind of the processing gas, a flow rate of the processing gas, a power of the high frequency wave, a frequency of the high frequency wave, a power of the second high frequency wave supplied to the placing table on which the workpiece is placed, a frequency of the second high frequency wave, and a processing time.

5. A plasma processing apparatus comprising:
a high frequency wave supply unit configured to supply a high frequency wave; and
a control unit configured to: produce a plurality of processing conditions having different processing parameters, which are applied to an intermediate process performed between an ignition process that ignites plasma of a processing gas using a high frequency wave and a processing process that processes a workpiece by the plasma; sequentially perform the ignition process, the intermediate process applied with each of the processing conditions, and the processing process; measure, when the intermediate process is changed to the processing process, a power of a reflected wave of the high frequency wave during the processing process in association with each of the processing conditions; and selects, among the plurality of processing conditions, a processing condition in which the power of the reflected wave of the high frequency wave is minimized,
wherein the plasma processing apparatus includes a storage unit configured to store a recipe used when the ignition process, the intermediate process, and the processing process are performed, and the selecting rewrites the recipe such that the selected processing condition is applied to the intermediate process.

* * * * *